United States Patent
Chung et al.

(10) Patent No.: US 12,356,580 B2
(45) Date of Patent: Jul. 8, 2025

(54) BAFFLE STRUCTURE, RACK, AND SERVER SYSTEM

(71) Applicant: Fulian Precision Electronics (Tianjin) Co., LTD., Tianjin (CN)

(72) Inventors: Hung-Liang Chung, New Taipei (TW); Chih-Feng Chang, Tu-Cheng (TW); Yu-Guei Sung, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 202 days.

(21) Appl. No.: 18/371,424

(22) Filed: Sep. 21, 2023

(65) Prior Publication Data
US 2024/0373583 A1 Nov. 7, 2024

(30) Foreign Application Priority Data
May 4, 2023 (CN) .......................... 202310492286.9

(51) Int. Cl.
*H05K 7/18* (2006.01)
*H05K 7/14* (2006.01)

(52) U.S. Cl.
CPC ............. *H05K 7/18* (2013.01); *H05K 7/1488* (2013.01)

(58) Field of Classification Search
CPC ....................................................... G06F 1/181
See application file for complete search history.

(56) References Cited

U.S. PATENT DOCUMENTS

| | | | | |
|---|---|---|---|---|
| 2009/0239461 | A1* | 9/2009 | Lewis, II ........... | H05K 7/20736 454/184 |
| 2010/0061059 | A1* | 3/2010 | Krietzman ......... | H05K 7/20754 361/690 |

* cited by examiner

*Primary Examiner* — Jerry Wu
(74) *Attorney, Agent, or Firm* — ScienBiziP, P.C.

(57) ABSTRACT

A baffle structure includes a main body, a first board, and a second board. The first board has a first sliding groove and a second sliding groove. The main body is slidable along the first sliding groove, making the first board movable between a first height position and a second height position below the first height position. The second board is located on the first board. The second board is slidable along the second sliding groove. The second board is movable to a third height position below the second height position. By moving the first board and the second board to the first height position, the second height position, and the third height position, the baffle structure can be quickly switched between a transportation mode, a foot protection mode, and a wind blocking mode. A rack and a server system using the baffle structure are also disclosed.

18 Claims, 7 Drawing Sheets

BAFFLE STRUCTURE, RACK, AND SERVER SYSTEM

FIELD

The disclosure herein generally relates to information handling systems, and more particularly relates to a baffle structure, a rack, and a server system.

BACKGROUND

When the rack of the server system is placed in the data center, it needs to dissipate heat through the hot aisles and cold aisles. Thermal isolation is required between the hot aisles and the cold aisles, so usually the space inside the rack is equipped with isolation baffles. And the space outside the rack needs to prevent cold air from flowing into the hot aisle or prevent hot air flowing into the cold aisle, so baffles are usually installed at the front and rear of the rack on bottom to block the air circulation. The baffles need to contact the ground to block the air circulation when the rack is not moving. But when the rack needs to be moved, it is necessary to remove the baffles to avoid friction, causing that people's feet are easy to reach into the bottom of the rack. And, when the baffles are not needed, it is necessary to find an additional place to place the removed baffles.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
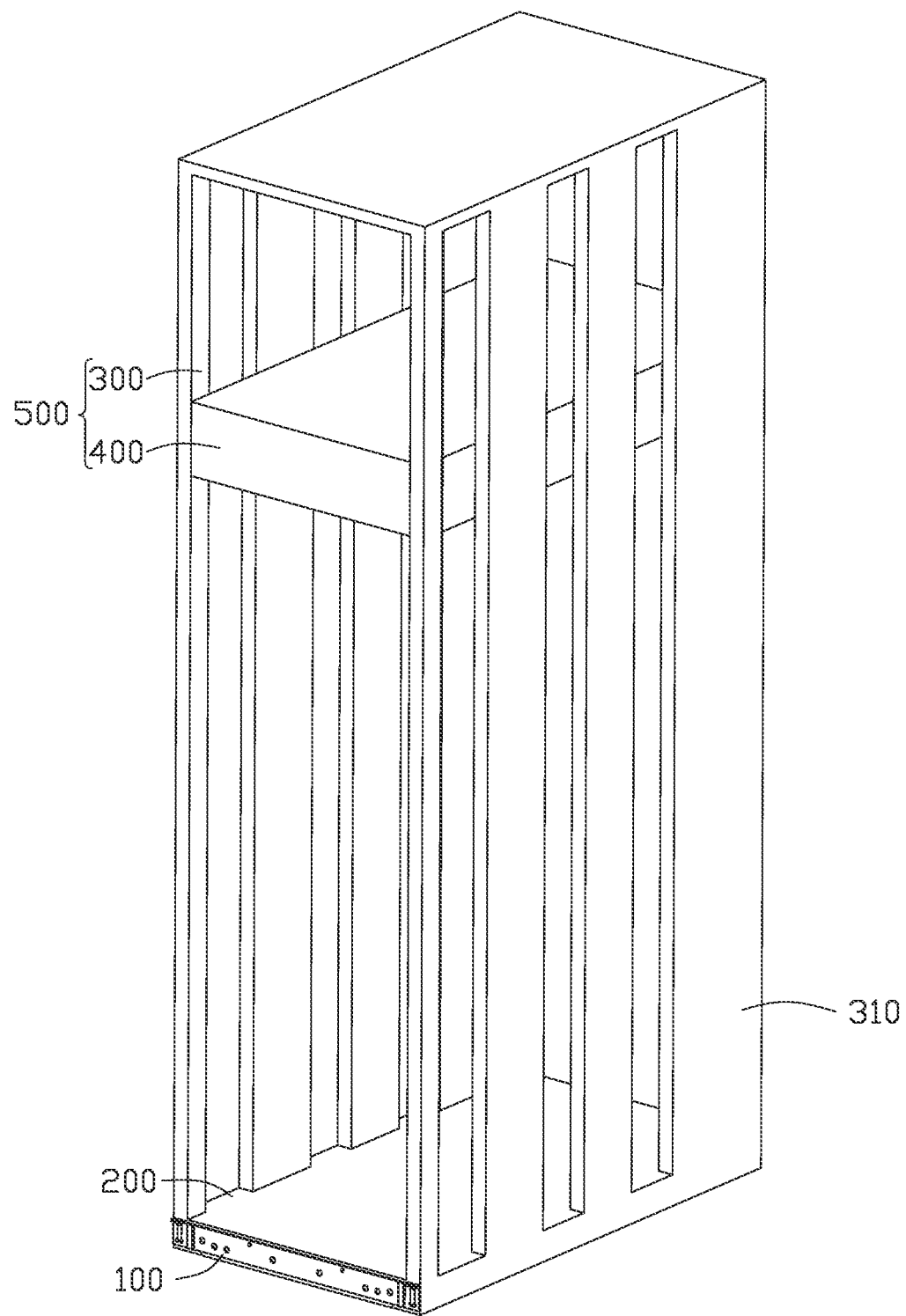
FIG. 1 is an isometric view of a server system according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, baffle structures, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

The term "comprising" means "including, but not necessarily limited to"; it specifically indicates open-ended inclusion or membership in a so-described combination, group, series, and the like.

Without a given definition otherwise, all terms used have the same meaning as commonly understood by those skilled in the art. The terms used herein in the description of the present disclosure are for the purpose of describing specific embodiments only, and are not intended to limit the present disclosure.

Figure 2:
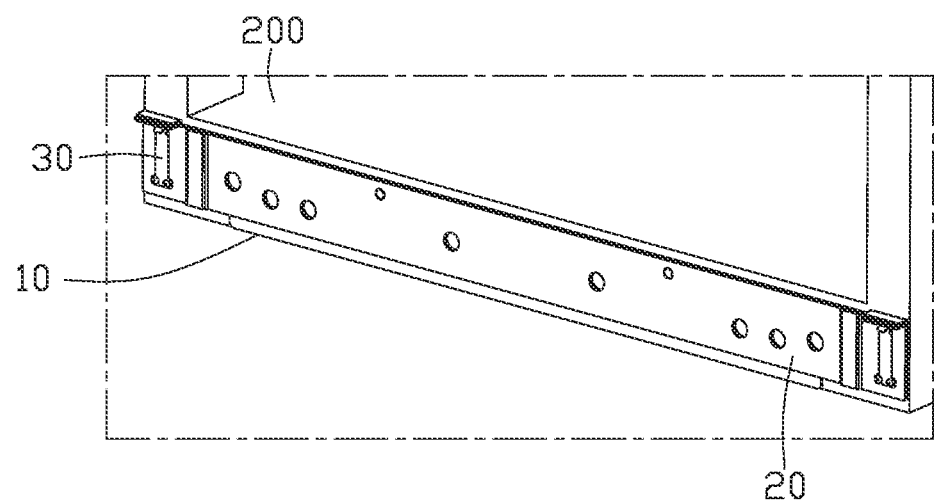
FIG. 2 is an isometric view of a baffle structure in a transportation mode according to an embodiment of the present disclosure.

As shown in FIG. 1 and FIG. 2, a baffle structure 100 applied to a rack 300 of a server system in an embodiment includes a chassis 310, a first board 10, a second board 20, and a positioning piece 30. The chassis 310 is located on a placement surface. The bottom of the chassis 310 forms a main body 200, and the main body 200 serves as an installation foundation of the first board 10, the second board 20, and the positioning piece 30. The first board 10 is located on the main body 200, and the first board 10 is movable up and down relative to the main body 200. The second board 20 is located on the first board 10, and the second board 20 is movable up and down relative to the first board 10. The first board 10 can move up and down relative to the main body 200 between a first height position and a second height position, and the first height position is located above the second height position. When the first board 10 is at the second height position, the second board 20 can slide to a third height position relative to the first board 10, and the third height position is located below the second height position. The positioning piece 30 is used to lock the positions of the first board 10 and the second board 20 relative to the main body 200.

In some embodiments, the placement surface is substantially horizontal. For example, the placement surface can be a ground or a floor of a server room which can place the rack 300.

Figure 3:
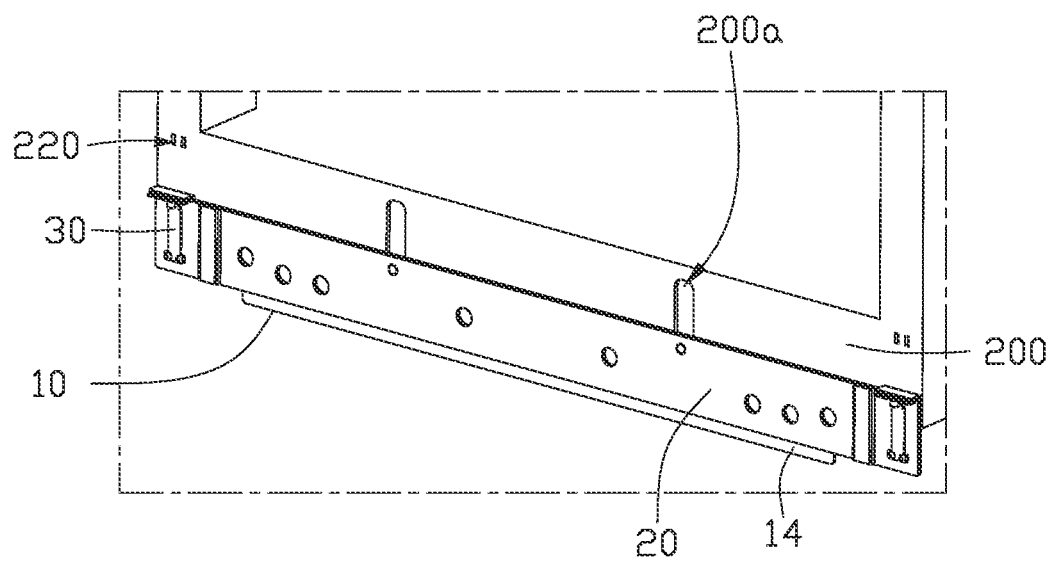
FIG. 3 is an isometric view of a baffle structure in a foot protection mode according to an embodiment of the present disclosure.
Figure 4:
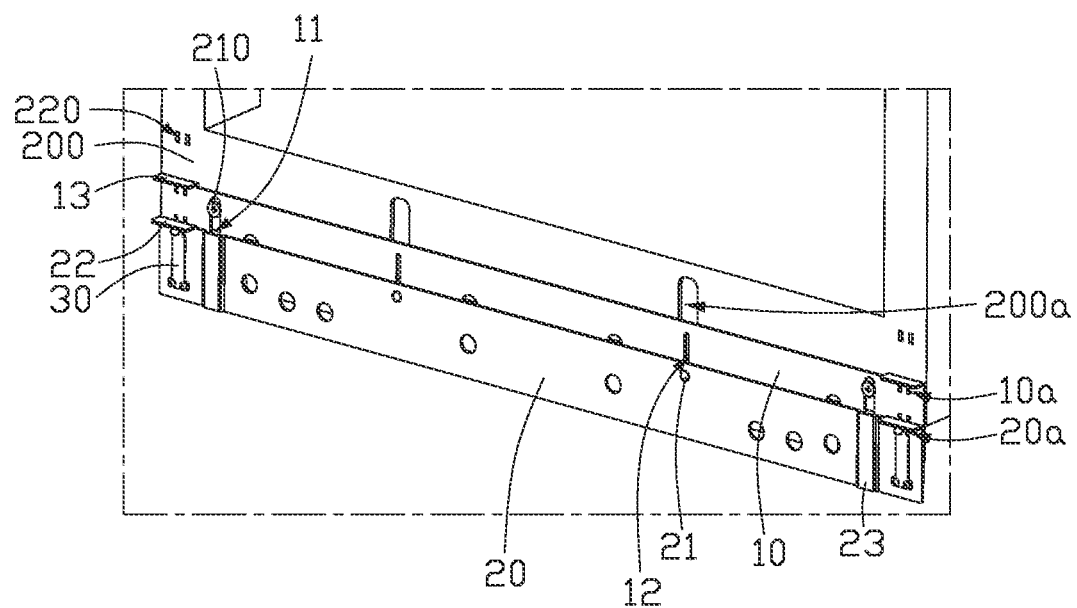
FIG. 4 is an isometric view of a baffle structure in a wind blocking mode according to an embodiment of the present disclosure.

As shown in FIG. 2 to FIG. 4, a gap is defined between the bottom of the chassis 310 and the placement surface. When the first board 10 and the second board 20 are both located at the first height position, the gap is completely exposed for transportation, or the gap is fully utilized for maintenance or cleaning operations. In this state, the baffle structure 100 works as a transportation mode.

When the first board 10 and the second board 20 are both located at the second height position, the first board 10 and the second board 20 cover part of the gap and do not contact the placement surface, so that the rack 300 is movable and meanwhile the first board 10 and the second board 20 can prevent people's feet from extending into the gap, thereby preventing accidents. In this state, the baffle structure 100 works as a foot protection mode.

When the first board 10 is located at the second height position and the second board 20 is located at the third height position, the second board 20 contacts the placement surface, and the first board 10 and the second board 20 completely cover the gap, so that the first board 10 and the second board 20 can isolate a hot aisle and a cold aisle on opposite sides of the rack 300, for preventing a cold air in the cold aisle from flowing to the hot aisle on the other side, or preventing a hot air on the hot aisle from flowing to the cold aisle on the other side. In this state, the baffle structure 100 works as a wind blocking mode.

In some embodiments, the main body 200 includes a first fixing piece 210. The first board 10 has a first sliding groove 11. The first sliding groove 11 is substantially vertical. The first fixing piece 210 is slidably connected in the first sliding groove 11, so that the first board 10 can slide between the first height position and the second height position without breaking away from the main body 200. For example, the first fixing piece 210 is a screw, the size of the screw head is greater than the width of the first sliding groove 11, and the edge of the first sliding groove 11 is located between the screw head and the main body 200, thereby preventing the first board 10 from breaking away from the main body 200.

In some embodiments, first board 10 has a second sliding groove 12. The second board 20 includes a second fixing piece 21. The second fixing piece 21 is slidably connected in the second sliding groove 12, so that the second board 20 can slide up and down relative to the first board 10 without breaking away from the first board 10.

In some embodiments, the main body 200 has a first positioning groove 220 and a second positioning groove 230. The first positioning groove 220 is located above the second positioning groove 230. The first board 10 has a first positioning hole 10a. The second board 20 has a second positioning hole 20a. When the first board 10 and the second board 20 are both located at the first height position, the first positioning hole 10a and the second positioning hole 20a are aligned with the first positioning groove 220 at the same time. When the first board 10 and the second board 20 are both located at the second height position, the first positioning hole 10a and the second positioning hole 20a are aligned with the second positioning groove 230. The positioning piece 30 is located on a side of the second board 20 facing away from the first board 10. One end of the positioning piece 30 can be sequentially inserted into the aligned second positioning hole 20a, the first positioning hole 10a, and the first positioning groove 220, or sequentially inserted into the aligned second positioning hole 20a, the first positioning hole 10a, and the second positioning groove 230, so to position the first board 10 and the second board 20 at the first height position or the second height position.

Figure 6:
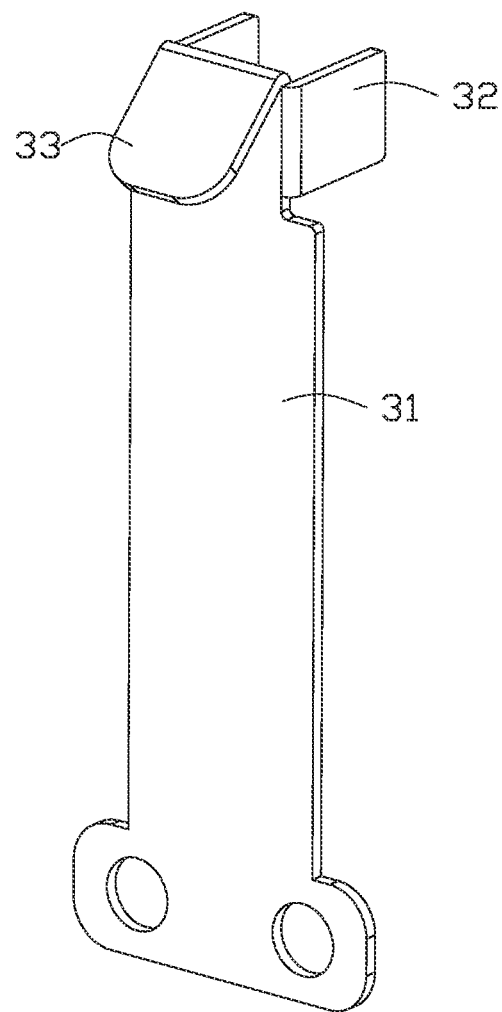
FIG. 6 is an isometric view of a positioning piece according to an embodiment of the present disclosure.

In some embodiments, as shown in FIG. 6, the positioning piece 30 is a sheet metal piece and the positioning piece 30 includes a main board 31, a latching board 32, and a handle 33. The bottom of the main board 31 is fixed to the second board 20 by screws. The latching board 32 is located on the top of the main board 31, and the latching board 32 is insertable into the second positioning hole 20a, the first positioning hole 10a, the first positioning groove 220 and second positioning groove 230. The handle 33 is located on the top of the main board 31 and is located on a side of the main board 31 opposite to the second board 10. The operator can bend the main board 31 by pulling the handle 33 until the latching board 32 is separated from the second positioning hole 20a, the first positioning hole 10a, the first positioning groove 220, and the second positioning groove 230. When the operator releases the handle 33, the main board 31 can insert the latching board 32 into the second positioning hole 20a, the first positioning hole 10a, the first positioning groove 220, and the second positioning groove 230 through elasticity. The positioning piece 30 has a simple structure and is easy to process to improve production efficiency and reduce costs.

In some embodiments, the first board 10 includes a first bended part 13 on top. The first bended part 13 is perpendicular to the first board 10. The operator can lift or press down the first board 10 through the first bended part 13.

In some embodiments, the second board 20 includes a second bended part 22 on top. The second bended part 22 is perpendicular to the second board 20. The operator can lift or press down the second board 20 through the second bended part 22. The length of the second bended part 22 is greater than or equal to the length of the first bended part 13, so that the second bended part 22 can extend out of the first bended part 13, to expose the second bended part 22 and prevent the second bended part 22 from being hidden under the first bended part 13.

In some embodiments, the second board 20 includes an avoiding part 23. The avoiding part 23 extends vertically. The avoiding part 23 protrudes from the second board 20 in a direction away from the first board 10, forming a gap between the avoiding part 23 and the first board 10, and the gap is used to accommodate the first fixing piece 210, so to prevent the first fixing piece 210 from interfering with the movement of the second board 20. For example, the second board 20 is formed by stamping.

In some embodiments, the first board 10 includes an extension part 14 on bottom. The length of the extension part 14 is less than the length of the first board 10.

The extension part 14 is arranged symmetrically along a central vertical line of the first board 10. The extension part 14 at the second height position is located above the bottom of the second board 20 at the third height position. When transporting the rack 300, the operator's feet are most likely to be located at the center of the gap between the main body 200 and the placement surface, so the extension part 14 is used to partially cover the gap between the main body 200 and the placement surface and the extension part 14 does not contact the placement surface, which not only allows the rack 300 to move, but also prevents the operator's feet from extending into the bottom of the rack 300.

Figure 7:
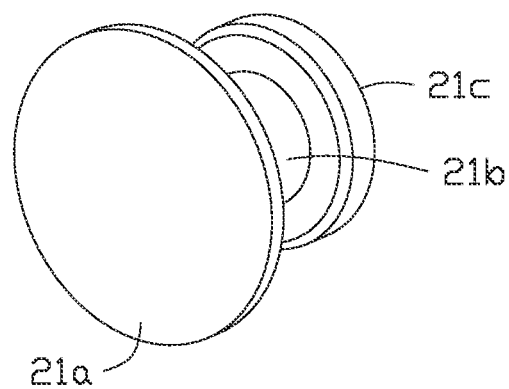
FIG. 7 an isometric view of a second fixing piece according to an embodiment of the present disclosure.

In some embodiments, as shown in FIG. 7, the second fixing piece 21 includes a fixing part 21a, a connecting part 21b and a stopping part 21c. The diameter of the connecting part 21b is smaller than the diameters of the fixing part 21a and the stopping part 21c. The fixing part 21a is located on the second board 20. The connecting part 21b is inserted into the second sliding groove 12 and is slidable along the second sliding groove 12. The stopping part 21c is located on a side of the first board 10 facing away from the second board 20, so that the edge of the second sliding groove 12 is sandwiched between the fixing part 21a and the stopping part 21c, thereby preventing the second board 20 from breaking away from the first board 10.

In some embodiments, the main body 200 has an avoidance slot 200a. The avoidance slot 200a extends vertically. The avoidance slot 200a is used for accommodating the stopping part 21c, preventing the stopping part 21c from interfering with the main body 200, thereby allowing the movement of the first board 10.

In some embodiments, the second sliding groove 12 has an expansion hole 12a on bottom. The diameter of the expansion hole 12a is larger than the width of the second sliding groove 12. The expansion hole 12a is used to accommodate the connecting part 21b and the stopping part 21c, so that the stopping part 21c can pass through the first board 10 through the expansion hole 12a, thereby allowing the second fixing piece 21 to be installed on the second board 20.

Figure 5:
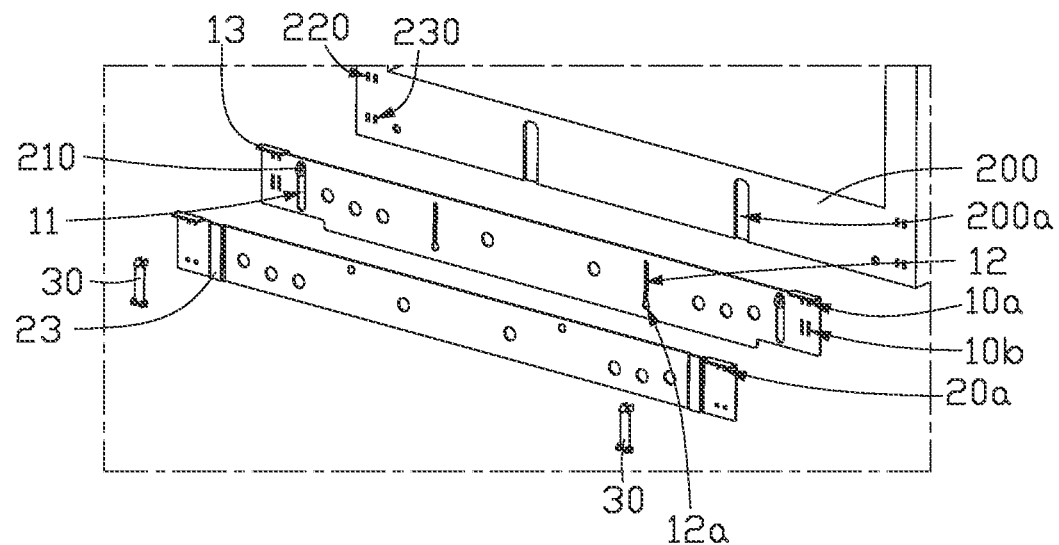
FIG. 5 is an exploded view of a baffle structure according to an embodiment of the present disclosure.

In some embodiments, as shown in FIG. 5, the first board 10 further has a storage hole 10b. The storage hole 10b extends vertically. The length of the storage hole 10b is greater than the length of the latching board 32. When the second board 20 is located at the third height position, the storage hole 10b is used to accommodate the latching board As shown in FIG. 1, a rack 300 in one embodiment includes the chassis 310 and the baffle structure 100. The baffle structure 100 in the rack 300 can be quickly switched between three modes: transportation mode, foot protection mode, and wind blocking mode, thus achieving the purpose of improving efficiency.

As shown in FIG. 1, a server system 500 in one embodiment includes a plurality of servers 400 and the rack 300. The rack 300 includes the chassis 310 and the baffle structure 100. The plurality of servers 400 are installed in the chassis 310.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A baffle structure comprising: a main body comprising a first fixing piece, wherein a first positioning groove and a second positioning groove are defined on the main body, and the first positioning groove is located above the second positioning groove; a first board located on the main body, wherein a first sliding groove, a second sliding groove, and a first positioning hole are defined on the first board, and the first fixing piece is slidable along the first sliding groove to allow the first board move between a first height position and a second height position, and the first height position is above the second height position; a second board located on the first board and comprising a second fixing piece, wherein a second positioning hole is defined on the second board, and the second fixing piece is slidable along the second sliding groove to allow the second board move, from the second height position, to a third height position below the second height position; and a positioning piece located on the second board and is configured for positioning the first board and the second board, wherein when the first board and the second board are located at the first height position, the first positioning hole and the second positioning hole are aligned with the first positioning groove to insert the positioning piece, and when the first board and the second board are located at the second height position, the first positioning hole and the second positioning hole are aligned with the second positioning groove to insert the positioning piece; and the positioning piece comprises a main board, a latching board, and a handle, a bottom of the main board is connected to the second board, the latching board is located on a top of the main board, the latching board is insertable into the second positioning hole, the first positioning hole, the first positioning groove, and the second positioning groove, the handle is located on the top of the main board, the main board is bendable to pull the latching board out of the second positioning hole, the first positioning hole, the first positioning groove, and the second positioning groove.

2. The baffle structure of claim 1, wherein a first bended part is located on a top of the first board, the first bended part is substantially perpendicular to the first board, the first bended part is configured for lifting or pressing down the first board.

3. The baffle structure of claim 2, wherein a second bended part is located on a top of the second board, the second bended part is substantially perpendicular to the second board, the second bended part is configured for lifting or pressing down the second board, a length of the second bended part is greater than or equal to a length of the first bended part, to allow the second bended part extend out of the first bended part.

4. The baffle structure of claim 1, wherein the second board further comprises an avoiding part, the avoiding part extends vertically and protrudes from the second board, a gap is defined between the avoiding part and the first board, the gap between the avoiding part and the first board is configured for accommodating the first fixing piece.

5. The baffle structure of claim 1, wherein the first board comprises an extension part on bottom, a length of the extension part is less than a length of the first board, the extension part is arranged symmetrically along a central vertical line of the first board, when the first board and the second board are located at the second height position, the extension part is higher than a bottom of the second board.

6. The baffle structure of claim 1, wherein the second fixing piece comprises a fixing part, a connecting part, and a stopping part, the fixing part is located on the second board, the connecting part is inserted into the second sliding groove and slidable along the second sliding groove, the stopping part is located on a side of the first board away from the second board.

7. The baffle structure of claim 6, wherein an avoidance slot is defined on the main body, the avoidance slot extends vertically and is configured for accommodating the stopping part.

8. The baffle structure of claim 6, wherein an expansion hole is defined on a bottom the second sliding groove, a diameter of the expansion hole is larger than a width of the second sliding groove, the stopping part passes through the first board and the expansion hole to allow the second fixing piece to be installed on the second board.

9. The baffle structure of claim 1, wherein the first board comprises a storage hole, the storage hole extends vertically, a length of the storage hole is greater than a length of the latching board, when the second board is located at the third height position, the storage hole is configured for accommodating the latching board.

10. A rack comprising: a chassis located on a placement surface, wherein a bottom of the chassis forming a main body and a gap is defined between the main body and the placement surface, the main body comprises a first fixing piece, a first positioning groove and a second positioning groove are defined on the main body, the first positioning groove is located above the second positioning groove; and a baffle structure comprising: a first board located on the main body, wherein a first sliding groove, a second sliding groove, and a first positioning hole are defined on the first board, and the first fixing piece is slidable along the first sliding groove to allow the first board move between a first height position and a second height position, and the first height position is above the second height position; a second board located on the first board and comprising a second fixing piece, wherein a second positioning hole is defined on the second board, and the second fixing piece is slidable along the second sliding groove to allow the second board move, from the second height position, to a third height position below the second height position, when the second board located at the third height position, the second board contacts the placement surface; and a positioning piece located on the second board and is configured for positioning the first board and the second board, wherein when the first board and the second board are located at the first height position, the gap between the main body and the placement surface is fully exposed, the first positioning hole and the second positioning hole are aligned with the first positioning groove to insert the positioning piece, when the first board and the second board are located at the second height position, the gap between the main body and the placement surface is partially covered, the first positioning hole and the second positioning hole are aligned with the second positioning groove to insert the positioning piece, and when the first board is located at the second height position and the second board is located at the third height position, the gap between the main body and the placement surface is fully covered; and the second board further comprises an avoiding part, the avoiding part extends vertically, the avoiding part protrudes from the second board, a second gap is defined between the avoiding part and the first board, the second gap between the avoiding part and the first board is configured for accommodating the first fixing piece.

11. The rack of claim 10, wherein the positioning piece comprises a main board, a latching board and a handle, a bottom of the main board is connected to the second board, the latching board is located on a top of the main board, the latching board is insertable into the second positioning hole, the first positioning hole, the first positioning groove, and the second positioning groove, the handle is located on the top of the main board, the main board is bendable to pull the latching board out of the second positioning hole, the first positioning hole, the first positioning groove, and the second positioning groove.

12. The rack of claim 10, wherein a first bended part is located on a top of the first board, the first bended part is substantially perpendicular to the first board, the first bended part is configured for lifting or pressing down the first board.

13. The rack of claim 12, wherein a second bended part is located on a top of the second board, the second bended part is substantially perpendicular to the second board, the second bended part is configured for lifting or pressing down the second board, the length of the second bended part is greater than or equal to the length of the first bended part, to allow the second bended part extend out of the first bended part.

14. The rack of claim 10, wherein the first board comprises an extension part on bottom, the length of the extension part is less than the length of the first board, the extension part is arranged symmetrically along a central vertical line of the first board, the extension part at the second height position is higher than the bottom of the second board at the third height position.

15. The rack of claim 10, wherein the second fixing piece comprises a fixing part, a connecting part, and a stopping part, the fixing part is located on the second board, the connecting part is inserted into the second sliding groove and slidable along the second sliding groove, the stopping part is located on a side of the first board opposite to the second board.

16. The rack of claim 15, wherein an avoidance slot is defined on the main body, the avoidance slot extends vertically, the avoidance slot is configured for accommodating the stopping part.

17. The rack of claim 15, wherein an expansion hole is defined on the bottom the second sliding groove, the diameter of the expansion hole is larger than the width of the second sliding groove, the stopping part passes through the first board through the expansion hole to allow the second fixing piece to be installed on the second board.

18. A server system comprising: a plurality of servers; and a rack comprising: a chassis located on a placement surface, wherein the chassis is configured for installing the plurality of servers, the bottom of the chassis forming a main body and a gap is defined between the main body and the placement surface, the main body comprises a first fixing piece, a first positioning groove and a second positioning groove are defined on the main body, the first positioning groove is located above the second positioning groove; and a baffle structure comprising: a first board located on the main body, wherein a first sliding groove, a second sliding groove, and a first positioning hole are defined on the first board, and the first fixing piece is slidable along the first sliding groove to allow the first board move between a first height position and a second height position, and the first height position is above the second height position; a second board located on the first board and comprising a second fixing piece, wherein a second positioning hole is defined on the second board, and the second fixing piece is slidable along the second sliding groove to allow the second board move to a third height position below the second height position, the second board at the third height position contacts the placement surface; and a positioning piece located on the second board and is configured for positioning the first board and the second board; wherein when the first board and the second board are at the first height position, the gap between the main body and the placement surface is fully exposed, the first positioning hole and the second positioning hole are aligned with the first positioning groove to insert the positioning piece; when the first board and the second board are at the second height position, the gap between the main body and the placement surface is partially covered, the first positioning hole and the second positioning hole are aligned with the second positioning groove to insert the positioning piece; when the first board is at the second height position and the second board is at the third height position, the gap between the main body and the placement surface is fully covered; and a first bended part is located on a top of the first board, the first bended part is substantially perpendicular to the first board, the first bended part is configured for lifting or pressing down the first board.

* * * * *